United States Patent [19]

van der Velden

[11] 4,381,961

[45] May 3, 1983

[54] PRINTING CYLINDER WITH AN OUTSIDE COVERING AND A METHOD AND APPARATUS FOR APPLYING A COVERING ON A CYLINDER SURFACE

[75] Inventor: Hendricus H. van der Velden, Rn Cuyk, Netherlands

[73] Assignee: Stork Screens B.V., Boxmeer, Netherlands

[21] Appl. No.: 267,599

[22] Filed: May 27, 1981

[30] Foreign Application Priority Data

May 28, 1980 [NL] Netherlands .................. 8003073

[51] Int. Cl.³ .................... B29C 17/04; B41F 13/10
[52] U.S. Cl. .................................... 156/215; 101/375; 156/285; 156/286; 156/294; 156/312; 156/308.2; 156/309.6
[58] Field of Search ............... 156/285, 312, 286, 323, 156/304.1, 215, 294, 383.3, 308.2, 309.6; 101/375, 368; 264/512, 516

[56] References Cited

U.S. PATENT DOCUMENTS

| | | | |
|---|---|---|---|
| 2,343,225 | 2/1944 | Pray et al. | 156/294 |
| 2,429,121 | 10/1947 | Crowley | 156/285 |
| 2,762,736 | 9/1956 | Beuglet | 156/286 |
| 3,010,194 | 11/1961 | Fratzke | 156/285 |
| 3,405,019 | 10/1968 | Seil et al. | 156/286 |
| 3,933,562 | 1/1976 | Cruckshank et al. | 156/285 |
| 3,962,394 | 6/1976 | Hall | 156/285 |

Primary Examiner—Jerome W. Massie
Attorney, Agent, or Firm—Watson, Cole, Grindle & Watson

[57] ABSTRACT

Printing cylinder with an outside covering of a thermoplastic elastomeric composition which can be hardened by exposure to light, the covering being snugly applied to the circumference of the cylinder by suction in the annular clearance between cylinder and covering; the cylinder comprising several coaxial parts during the covering process, only the central portion with its covering forming the printing cylinder.

3 Claims, 5 Drawing Figures

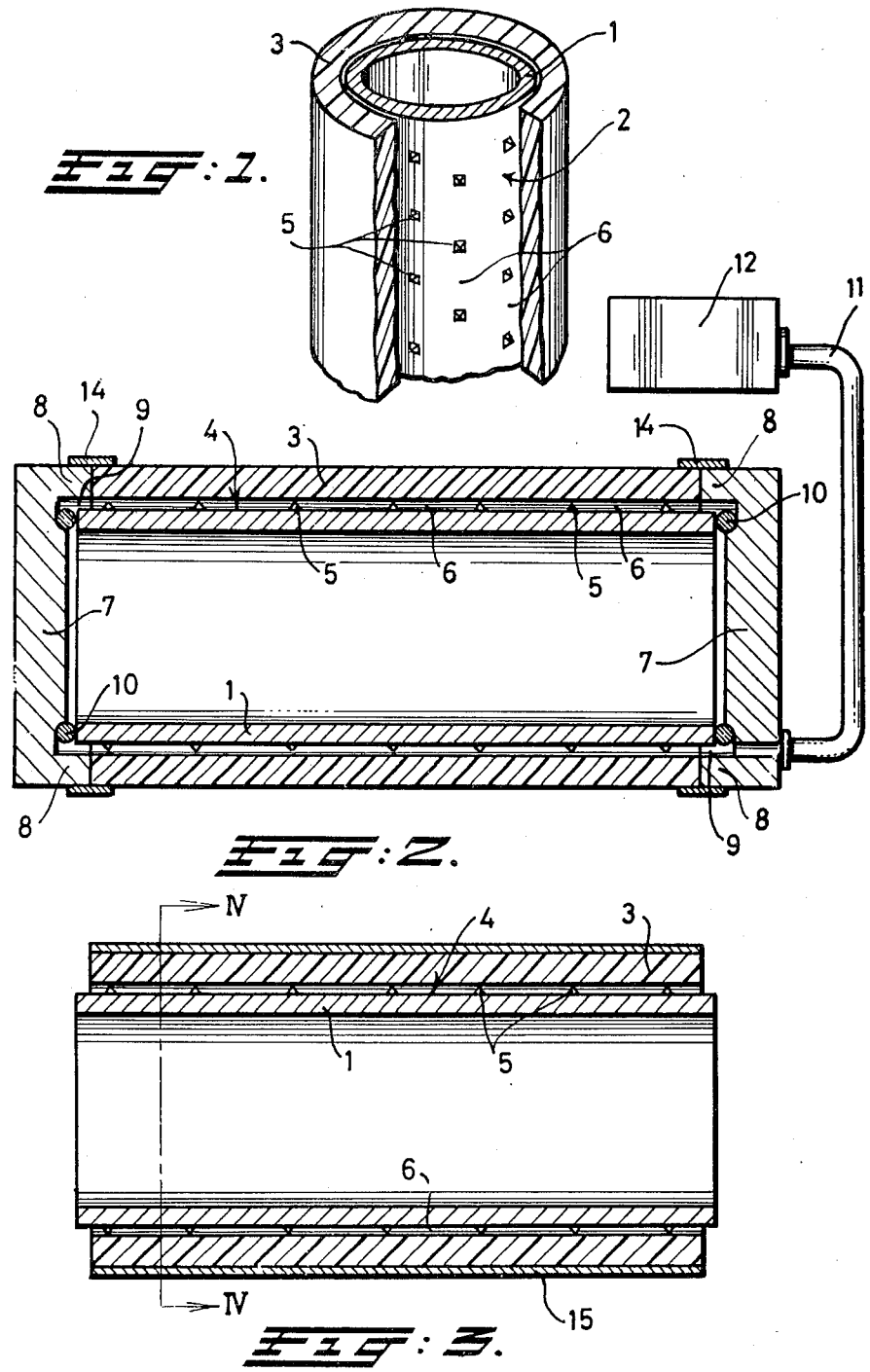

PRINTING CYLINDER WITH AN OUTSIDE COVERING AND A METHOD AND APPARATUS FOR APPLYING A COVERING ON A CYLINDER SURFACE

RELATED APPLICATION

This application relates to U.S. Ser. No. 277,866, filed June 26, 1981, and commonly owned herewith.

BACKGROUND OF THE INVENTION

1. Field of the Invention

The present invention relates to a printing cylinder which is covered at the outside with a layer of a thermoplastic elastomeric composition. The layer can be hardened by light and is formed by attaching a covering material in sheet form to the cylinder surface under the influence of heat and pressure.

2. Description of the Prior Art

A printing cylinder of this type is known in the art. To manufacture such a known cylinder a sheet of covering material is attached to the cylinder surface prior to exposure to light in such a way that the edges of the sheet which are to be joined are very close fitting to each other, which is accomplished by forming a certain shape to both edges. When the thermoplastic sheet has been wrapped around the cylinder, the sheet is attached to the cylinder surface by application of heat and pressure to the sheet, during which operation also the two edges are attached to each other.

This known printing cylinder has the drawback that due to the application of mechanical pressure at relatively high temperatures, an unevenness in the covering is easily introduced which must therefore be removed by subsequent grinding operations.

Additionally, inclusion of air between the covering layer and the cylinder surface is frequently observed.

SUMMARY OF THE INVENTION

It is an object of the present invention to provide a printing cylinder which has the aforementioned drawbacks. According to the invention this object is obtained by providing a plurality of channels or cavities in the cylinder surface opposite the covering layer, which channels are arranged in a regular pattern and which are interconnected.

Preferably a regular pattern of cavities, channels or indentations is formed in the cylinder surface, the cavities, channels or indentations being connected together and with both ends of the cylinder. Upon use of such a cylinder surface prior to the heating of the cylinder and the covering which is wrapped around the cylinder, a vacuum may be formed in the space between the covering and the cooperating cylinder surface, by which action the covering is pressed firmly onto the cylinder surface and adhered to the surface without the danger of air inclusions between the covering and the cylinder surface. By maintaining a vacuum in the space between the cylinder surface and the covering, gases or vapors which would otherwise accumulate in such space are removed, resulting in an optimal adhesion.

A further advantage of such a printing cylinder consists in that the covering is applied without tension and that accordingly an eventual plastic memory effect of the covering is avoided.

Thus, fewer wear problems and fewer problems relating to the seam formed by joining the edges of the sheet of elastomeric composition, are observed.

It is another object of the present invention to provide a method for covering a printing cylinder surface with a thermoplastic elastomeric composition which can be hardened by exposure to actinic radiation in which method a sheet of the elastomeric composition is wrapped around the cylinder thereby covering the surface completely and fitting closely; subsequently the sheet is attached by application of heat and pressure to the cylinder surface. Specifically, a sheet of elastomeric material is wrapped around a cylinder surface which cylinder has a pattern of cavities or channels in such surface. A vacuum is generated in the cavities or channels between the cylinder surface and the covering, in order to remove accumulated gases, after which the cylinder with the sheet of material on its surface is heated while maintaining the vacuum.

Preferably heating is carried out at a temperature which lies between the glass transition temperature and the melting temperature of the elastomeric composition and more preferably to a temperature between 100° and 150° C., which temperature is maintained from 10 to 120 min. In a very suitble form of the present method, prior to the heating operation and after having wrapped the sheet around the cylinder, the sheet is enveloped at its outside with a very thin flexible material preferably in an overlapping manner, which overlap is situated at a suitable distance from the edges of the sheet of covering material which are to be joined, after which the heating operation is carried out. A very suitable form of the method is further distinguished in that after the period of heating the vacuum is shut off, the thin flexible material is removed, after which a second heating operation is carried out at a temperature of 100°–150° C. for 10–60 min. The used vacuum has preferably an absolute pressure of a maximum of 50 mm of mercury column, the temperature is preferably 140° C., the first heating period is preferably one hour and the second period half an hour. The flexible material preferably comprises a very thin foil such as a plasticized polyvinylchloride foil with a thickness of 2½ to 25 microns, preferably 15 microns.

It is another object of the present invention to provide an apparatus with which a covering can be applied on a printing cylinder surface which covering comprises a thermoplastic elastomeric composition which can be hardened by exposure to actinic radiation and where a sheet of the elastomeric composition is wrapped round the printing cylinder surface in a closely fitting manner after which the sheet by application of heat and outside pressure, is attached to the cylinder surface, comprising a printing cylinder surface and means for application of pressure to the sheet of covering material which apparatus according to the invention comprises means to generate a vacuum between the printing cylinder surface and a covering sheet.

The features of the present invention which are believed to be novel are set forth with particularity in the appended claims.

Other claims and many of the attendant advantages will be more readily appreciated as the same becomes better understood by reference to the following detailed description and considered in connection with the accompanying drawings.

DESCRIPTION OF THE DRAWINGS

FIG. 1 is a printing cylinder according to the present invention showing the covering partially removed;

FIG. 2 is a longitudinal side view of the apparatus for carrying out the method according to the invention wherein the covering sheet is not yet pressed to the surface of the printing cylinder;

FIG. 3 is a printing cylinder with a thin flexible material wrapped in an overlapping manner around the elastomeric composition;

DESCRIPTION OF A PREFERRED EMBODIMENT

Figure 4:
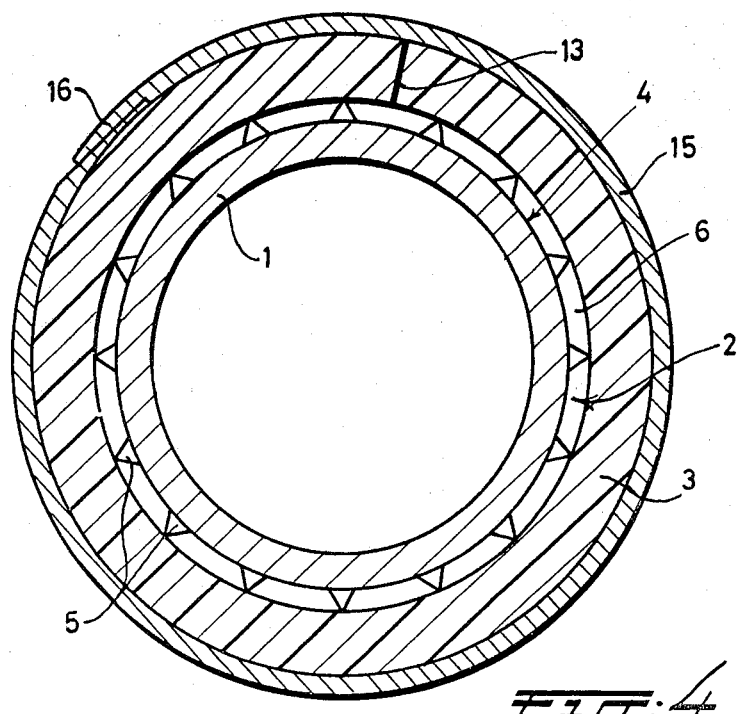
FIG. 4 is a cross section along line IV—IV in FIG. 3.
Figure 5:
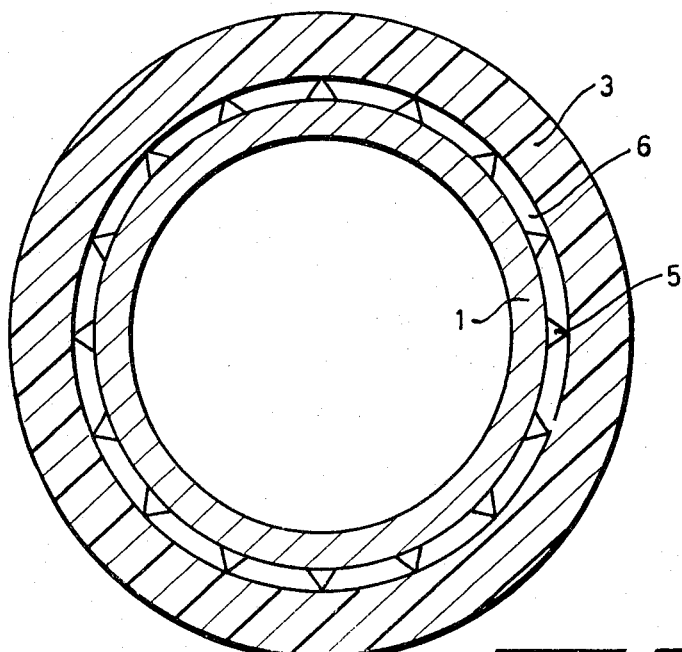
FIG. 5 is a cross section through a printing cylinder according to FIG. 1.

Referring now to FIG. 1 on the surface 2 of a metal cylinder 1 a sheet 3 of thermoplastic elastomeric composition is disposed. The sheet can be hardened with a light and a certain pattern may be formed thereon by exposure which may serve for the purpose of printing. In order to ensure proper adhesion of sheet 3 on the outside surface 4 of the metal cylinder, bulges 5 are applied which together form channels 6 which enable the removal of gases present between sheet 3 and the outside surface 4 thus ensuring optimal adhesion without air inclusions between the inside surface of sheet 3 and the outside surface 4 of the metal cylinder 1.

Instead of bulges 5 longitudinal channels can be provided in the outside surface 4 of the metal printing cylinder 1.

Referring now to FIG. 2 an apparatus serving for the application of sheet 3 on the surface 4 of a metal printing cylinder 1, comprises two cylindrical flanges 7 with a cylindrical raised border 8. In the flanges concentric channels 9 are formed which are sealed with an O-ring 10. These channels 9 of ring form are connected to a vacuum source 12 via tube 11. At the outside surface of the cylinder 1, sheet 3 of thermoplastic elastomeric composition which can be hardened by light is applied, which may be given a printing pattern by exposure to light for printing purposes. After application of sheet 3 adhesive tape 14 is applied covering the outside of the end-part of sheet 3 and the raised border 8 of flanges 7. Channel 9 is formed in such a way that the available clearance in the form of channels 6 is connected with channel 9. After application of adhesive tape 14, gas present between the outside surface 4 of cylinder 1 and the inside surface of sheet 3 is removed by suction; subsequently cylinder surface 4 of cylinder 1 is heated. Heating is carried out for 10 to 120 min; preferably for 10–60 min. at a temperature of 100°–150° C. In order to ensure an optimal attachment of the sheet of light hardenable thermoplastic elastomeric composition on the outer surface 4 of printing cylinder 1, after application of sheet 3, a thin foil 15 is wrapped around the entirety of cylinder 1 and sheet 3, which foil suitably consists of polyvinylchloride with a thickness of 2.5-25 microns, preferably of 15 microns. Overlap 16 is situated a good distance from the area where edges 13 of sheet 3 contact each other.

By maintaining the exhaust gases via tube 11 and vacuum source 12 during the heating operation gases which are developed during heating are also removed, thereby ensuring an optimal adhesion between sheet 3 and surface 4 of cylinder 1.

The invention will now be explained more in detail in the following example.

EXAMPLE

A metal cylinder 1 with a surface 4 comprising longitudinally applied channels 6 which are formed by notches 5 on the outside of the cylinder, is covered with a sheet 3 of a thermoplastic elastomeric composition which may be hardened by exposure to light (Cyrel of DuPont). Edges 13 of sheet 3 are contacted in a close fitting manner. The assembly is subsequently introduced in an apparatus as outlined above. By creation of a vacuum of an absolute pressure of a maximum of 50 mm of mercury, preferably 20 mm, gases present between sheet 3 and surface 4 are removed. Subsequently, the assembly is wrapped with a polyvinylchloride foil with a thickness of 15 micrometer. After this the cylinder is heated to a temperature of 140° C. for one hour. Subsequently exhaust via vacuum source 12 is terminated, the wrapping foil 15 is removed after which another heating at 140° C. for half an hour is carried out. Upon application of wrapping foil 15 of polyvinylchloride, care is taken to form overlapping parts 16 at a sufficient distance from the seam which is formed by edges 13 of sheet 3. The assembly is subsequently cooled and a printing cylinder is obtained which is optimally united with sheet 3; after this sheet 3 can be processed to obtain the desired printing pattern. The used foil has a thickness of 2.5-25 micrometer, preferably a thickness of 10 to 20 microns, more preferably of 15 microns. The used foil is preferably a plasticized polyvinylchloride foil.

The cylinder 1 of the apparatus may be provided at both ends with a separate ring being located close to the cylinder 1 and having an outer diameter which corresponds to that of the cylinder. The coating or sheet 3 must have such a width that both additional rings are covered.

After the completion of the manufacturing process, both rings with their annular covering are discarded, thus eliminating the side edges of the printing cylinder. These side edges are noted to have a slightly increased thickness, which should be avoided in a printing cylinder.

What is claimed is:

1. A method for forming a printing cylinder comprising the steps of completely covering the outer surface of a cylinder with a closely fitting layer of a thermoplastic elastomeric composition adapted to be hardened by exposure to light, maintaining a space between said cylinder and said layer by the provision of a pattern of interconnected cavities or channels on said outer surface of said cylinder, enveloping the outer side of the layer with a flexible film of gas-tight material after application of the layer, applying a vacuum to said space for removing any accumulated gases, and thereafter heating said cylinder and said covered layer for 10 to 120 min. at a temperature of 100° to 150° C., while maintaining the vacuum, thereafter removing the application of vacuum and the film, and further heating said cylinder and said covered layer for 10 to 60 min. at a temperature of 100° to 150° C.

2. Method according to claim 1, wherein the vacuum is applied at a maximum absolute pressure of 50 mm of mercury in the space between said cylinder and said layer, the temperature during the heating step being maintained at 140° C. for a period of one hour and subsequently for a second period of half an hour.

3. Method according to claim 1, wherein the covering step includes joining free ends of the layer together, and the enveloping step includes overlapping free ends of the film and locating the overlapped ends a circumferential distance from the joined ends.

* * * * *